United States Patent [19]

Rauscher

[11] Patent Number: 4,896,109
[45] Date of Patent: Jan. 23, 1990

[54] PHOTOCONDUCTIVE CIRCUIT ELEMENT REFLECTOMETER

[75] Inventor: Christen Rauscher, Alexandria, Va.

[73] Assignee: The United States of America as represented by the Department of Energy, Washington, D.C.

[21] Appl. No.: 129,210

[22] Filed: Dec. 7, 1987

[51] Int. Cl.$^4$ ............................................. G01R 31/26
[52] U.S. Cl. ............................. 324/158 R; 324/77 A; 324/158 D
[58] Field of Search ................. 324/77 A, 158 R, 102, 324/158 D; 328/151; 307/352, 353

[56] References Cited

U.S. PATENT DOCUMENTS 3,278,846 10/1966 Patten et al. ...................... 324/77 A

FOREIGN PATENT DOCUMENTS 1164609 6/1985 U.S.S.R. ................................ 324/96

OTHER PUBLICATIONS

David H. Auston, "Impulse Response of Photoconductors in Transmission Lines," IEEE J. Quantum Electron, vol. QE-19, No. 4, 639–647, (Apr. 1983).
William R. Eisenstadt, Robert B. Hammond and Robert W. Dutton, "On-Chip Picosecond Time-Domain Measurements for VLSI and Interconnect Testing using Photoconductors," IEEE Trans. Electron Devices, vol. ED-32, No. 2, 364–369, (Feb. 1985).

Primary Examiner—Ernest F. Karlsen
Attorney, Agent, or Firm—Milton D. Wyrick; Paul D. Gaetjens; William R. Moser

[57] ABSTRACT

A photoconductive reflectometer for characterizing semiconductor devices at millimeter wavelength frequencies where a first photoconductive circuit element (PCE) is biased by a direct current voltage source and produces short electrical pulses when excited into conductance by short first laser light pulses. The electrical pulses are electronically conditioned to improve the frequency related amplitude characteristics of the pulses which thereafter propagate along a transmission line to a device under test. Second PCEs are connected along the transmission line to sample the signals on the transmission line when excited into conductance by short second laser light pulses, spaced apart in time a variable period from the first laser light pulses. Electronic filters connected to each of the second PCEs act as low-pass filters and remove parasitic interference from the sampled signals and output the sampled signals in the form of slowed-motion images of the signals on the transmission line.

12 Claims, 4 Drawing Sheets

PHOTOCONDUCTIVE CIRCUIT ELEMENT REFLECTOMETER

BACKGROUND OF THE INVENTION

This invention relates to the field of electronic reflectometry and, more specifically, to the measurement of extremely fast time or frequency based electronic signals utilized in the testing of circuits or devices at millimeter wavelength frequencies. This invention is the result of a contract with the Department of Energy (Contract No. W-7405-ENG-36).

It has long been common practice in the field of electronics, when seeking to characterize an unknown circuit or device, to introduce a known signal to the circuit or device and to thereafter measure the response to that signal. Often, the necessary information can be obtained through analysis of the time-varying, periodic signal reflected back toward the source of the known signal by the circuit or device under test (DUT). This reflected signal is made up of discrete frequency components which can be analyzed for information on the circuit or device.

For devices operating at millimeter wavelength frequencies, conventional testing has involved hollow waveguide measurement systems. However, these systems provide only marginal measurement accuracy because of parasitic effects associated with the waveguide to chip transition, poor circuit stability when testing circuits or devices which are active below the waveguide's cut-off frequency, and the inherent bandwidth limitations of the waveguide itself. The maximum achievable frequency band coverage with such a system is currently limited to approximately 60 GHz.

Other prior art measurement systems, involving direct connection of a signal generator to a DUT with fast sampling of the reflected and incident signals, are severely hampered by time resolution and frequency bandwidth limitations. In the case of time domain reflectometry, commercially available equipment generally is unable to achieve a time resolution better than about 25 ps. For frequency-domain measurements, commercial equipment can attain bandwidths (error corrected) of only about 26.5 GHz in a coaxial system.

Recently, significant advances have been reported concerning photoconductive circuit elements (PCE). These on-chip photoconductive semiconductor devices are characterized as exhibiting low conductance in dark conditions, and high conductance (low resistance) in the presence of light.

Photoconductive circuit elements are fabricated from semiconductive material. However, for most applications, the materials are either gallium arsenide, silicon, or indium phosphide. For microwave applications, as in the present invention, the preferred material is gallium arsenide (GaAs).

In their natural states, when subjected to incident light energy, these semiconductors undergo a change to the conductance state through the instantaneous generation of electron-hole pairs. Upon the removal of the light energy, however, these electron-hole pairs require a relatively long period to recombine and return the semiconductor material to the low conductance state. Thus, the conductance response of the material to an extremely fast pulse of light from a laser would be a pulse with an extremely fast rise time, followed by a relatively long decay time constant on the order of 100 ps.

It has been found, though, that this decay time constant can be improved through damaging the semiconductor material. This damage is effected by the addition of foreign atoms into the semiconductor, or by subjecting the semiconductor to radiation, usually in the form of alpha particles, protons, or neutrons.

These techniques reduce the decay time constant of the semiconductor by creating additional electron-hole pair recombination centers in the material. Decay time constants on the order of 1-2 ps have been attained with radiation damaged gallium arsenide PCEs when mounted directly onto a semiconductor chip as a gap in a high speed transmission line. Such an application was reported by D. H. Auston, "Impulse Response Of Photoconductors In Transmission Lines," IEEE J. Quantum Electron., QE-19, 639-647 (April 1983).

The advent of lasers capable of subpicosecond or femtosecond optical pulse widths has led to the utilization of the fast response time PCEs as pulse generators and sampling gates in response measurements. Such an application was described by W. R. Eisenstadt, "On-Chip Picosecond Time-Domain Measurements For VLSI And Interconnect Testing Using Photoconductors," IEEE Trans. Electron Devices ED-32, 364-369 (February 1985). This article deals with the use of fast switching PCEs mounted onto semiconductor substrates as gaps between sections of microstrip transmission line for use as pulse generators and sampling gates in device test procedures. In FIG. 2 of the article, several PCEs are shown located immediately downstream from the pulse generator only for the purpose of verifying their characteristics. A CPM dye laser was employed to provide the optical pulses for the PCEs.

For actual test measurement, the Eisenstadt article disclosed the arrangement illustrated in FIG. 3 of that article, where the DUT is situated between the generator PCE and a single sampler PCE. In that arrangement, the sampler PCE samples the charge from the output waveform of the DUT when stimulated into conductance by a time delayed derivative of the laser pulse used to stimulate the generator PCE, and provides output directly to a lock-in amplifier. A lock-in amplifier is basically a frequency sensitive voltmeter, well known in the art. The article does not disclose the use of PCEs for reflectance measurements.

The above-described articles of Auston and Eisenstadt are incorporated herein by reference.

The time delayed derivative laser pulses utilized by Eisenstadt are generated from a second synchronous beam from the laser which is reflected multiple times by an assembly of mirrors mounted on a translating stage. These multiple reflections lengthen the path of the pulses, thereby introducing a delay in the time the pulses take to reach the surface of the sampling PCE. Of course, these time delayed pulses could as well emanate from separate lasers.

If such a system is to be used in reflectometry applications to provide an accurate characterization of the DUT, the incident and responsive or reflected pulse signals must be sufficiently separated in time. In practical applications, this is not possible, partially because of size constraints dictated by high frequency, on-chip applications, where the close spacings severely limit the time separation between incident and reflected signals. However, it is also the result of residual reflections caused by impedance mismatches.

Ideally, the pulse generaor end of the system would be fully impedance matched to the transmission line connecting it to the DUT. In reality, unavoidable residual mismatches will always exist, which serve to re-reflect the signal reflected from the DUT. These re-reflections, and other higher order echoes, contaminate the incident pulse signal when they overlap the incident signal in time at the point of sampling.

A further problem with the prior art relates to the undesirable effects presented by parasitic interference inevitably associated with conventional on-chip implementations of PCE generator and sampling systems. Such parasitics can appreciably limit time resolution and overall bandwidth of the system, as well as introduce a frequency domain based filtering aspect into the otherwise time domain based sampling process. Parasitics have the effect of confusing the relationship between the low frequency output signal of the sampler and the actual signal on the transmission line. Parasitics can also be the cause of bothersome discontinuities on the transmission line, which can result in measurement errors.

Still further, the prior art fails to compensate for the fact that the PCE generated pulses do not resemble ideal Delta functions, but rather may be modeled as pulses with abrupt rise times and single time constant exponential decays, due to the relatively long electron-hole pair recombination period. Such a model represents a pulse whose amplitude spectrum begins to drop off at a rate of approximately 6 dB per octave for frequencies above a certain critical frequency determined by the decay time constant associated with the pulse. This causes the signal-to-noise ratio to begin to deteriorate. Similar problems are associated with the sampling process, which must also contend with a non-Delta function at the sampling gate window.

It is an object of the present invention to provide photoconductive reflectometer equipment that will yield accurate measurement of very fast electromagnetic signals, with excellent time resolution and bandwidth.

It is a further object of this invention to provide reflectometer equipment which minimizes the effect of undesirable reflected signals and parasitic interference.

It is still a further object to provide reflectometer equipment which includes means for shaping the generated incident pulse so as to provide a usable bandwidth significantly greater than conventional equipment.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus for providing a photoconductive reflectometer may comprise pulse means that generate extremely short electrical pulses for reflection by a high frequency semiconductor device. A plurality of photoconductive samplers are intermediate of the pulse means and the semiconductor device at locations effective iteratively admit samples of the electrical signals between the pulse means and the device. Optical excitation means excite the photoconductive samplers for extremely short periods and at intervals effective for the iterative admissions.

In a subassembly of the present invention, a pulse generator capable of producing electrical pulses having extremely narrow pulse widths is provided which comprises a photoconductive circuit element coupled to a direct current voltage source, the photoconductive circuit element being capable of conducting the current from the voltage source in the form of extremely fast electrical pulses. A laser is focused on the photoconductive circuit element to excite the photoconductive circuit element into extremely short periods of conductance with extremely short optical energy pulses. Pulse conditioning circuitry is connected to the photoconductive circuit element to improve the frequency related amplitude characteristics of the electrical pulses and to output the pulses.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Figure 1:
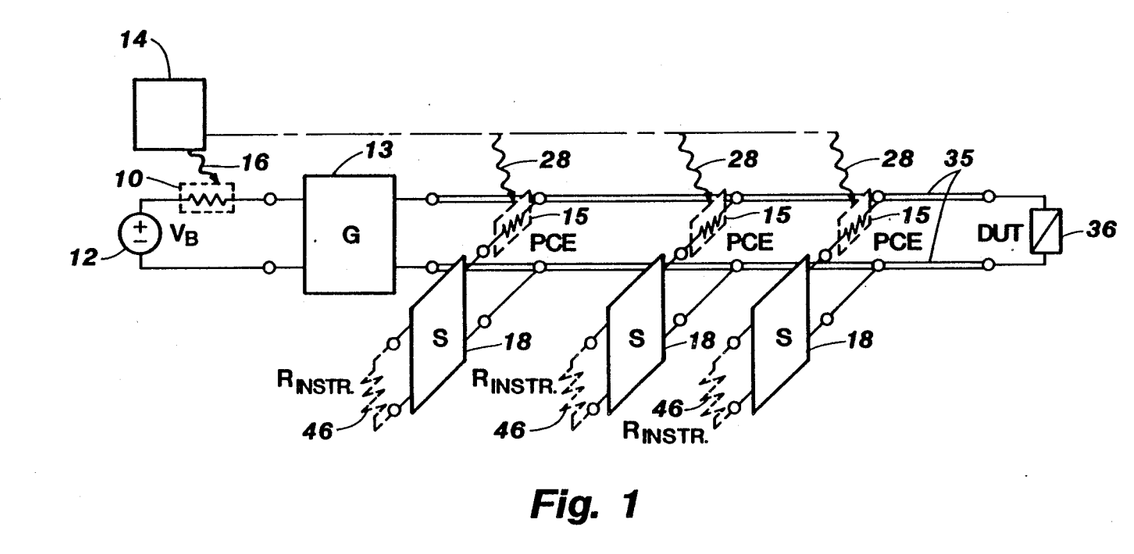
FIG. 1 is a conceptual block diagram of the photoconductive circuit element reflectometer.

Referring to FIG. 1, there is shown a conceptual block diagram of one embodiment of the present invention where PCE 10, a photoconductive circuit element, is utilized to produce a train of electrical pulses having extremely narrow pulse widths on the order of 2 ps. The preferred semiconductor material for PCE 10 is radiation damaged gallium arsenide (GaAs), although other semiconductor materials, such as silicon or indium phosphide, could be used.

PCE 10 is voltage biased by direct current voltage source 12 and connected to pulse conditioning network 13. The output of pulse conditioning network 13 is connected to transmission line 35, which, according to one embodiment, is of microstrip construction. The invention will operate as well with coaxial, coplanar waveguide, coplanar strip line, or slot line transmission lines.

Attached to transmission line 35 are three (3) sampler PCEs 15, also consisting of gallium arsenide, which are in turn connected to sampler networks 18. The outputs of sampler networks 18, being the processed samples of the electrical signals on transmission line 35, are connected to low-frequency recorder 46, which can take the form of any frequency-sensitive voltmeter, such as a lock-in amplifier. Where the prior art teaches the direct connection of PCEs 15 to recorder 46, the present invention utilizes the intervening circuitry of sampler networks 18 to optimally provide required low-pass filtering of the sampler PCEs 15 current response, to optimize sampler PCEs 15 response in the presence of parasitic circuit elements, and to minimize parasitic disturbance of signals on transmission line 35 by the presence of the sampler networks 18 structures.

Additionally, each sampler network 18 provides a low impedance radio-frequency path to ground so that substantially the entire time-varying, periodic signal to be sampled appears across the corresponding sampler PCE 15. The outputs of each sampler network 18 provide a slowed-motion image of the signals on transmission line 35. This slowed-motion image contains all of the information necessary to reconstruct the sampled electrical signals.

Transmission line 35 terminates at device under test (DUT) 36, which is the semiconductor device or circuit to be analyzed. In one embodiment of this invention, all of the components, including the DUT, are mounted onto a single semiconductor chip.

Operation of the PCE reflectometer is initiated by a train of extremely fast (femtosecond range) laser light pulses 16, having pulse widths in the range of 100 fs and spaced a few nanoseconds apart in time, from laser 14. These optical pulses 16 are focused on PCE 10, which in response becomes conductive for extremely short periods amounting to a few picoseconds, assuming a radiation-damaged PCE 10. The extremely short conductance periods of PCE 10 generate electrical pulses related to the energy furnished by voltage source 12. These electrical pulses (not shown) are shaped by pulse conditioning network 13 in a manner sufficient to compensate for the natural high frequency roll-off of the pulses. The compensation provided by pulse conditioning network 13 serves to flatten the amplitude envelope associated with the pulse, thus achieving a frequency response that is essentially flat well beyond the cut-off frequencies of conventional PCE based pulse generators. Pulse conditioning network 13 additionally impedance matches PCE 10 to transmission line 35 and minimizes parasitic disturbances.

The train of derivative laser pulses 28, spaced apart in time a variable period with respect to pulses 16, shown emerging from a broken line from laser 14, are derived through lengthening the path of a second synchronous laser beam from laser 14 by reflection from mirrors. These time delayed derivative laser pulses 28 also have extremely short pulse widths in the range of 100 fs and are focused on sampler PCEs 15. In response to the stimulation from derivative pulses 28, PCEs 15 repeatedly become conductive for extremely short periods of time amounting to a few picoseconds, thereby opening sampling windows for admission of samples of the time-periodic signals existing on transmission line 35 at the time of each derivative pulse 28. The time-periodic signal information admitted, which may be represented by a spectrum of discrete frequency components, is passed through sampler networks 18 to low frequency recorder 46. Sampler networks 18 minimize perturbation of the signals being sampled, and provide low-pass filtering required as part of the overall sampling process. It should be noted that derivative pulses 28 could be generated by one or more lasers in addition to laser 14, but operating in cooperation with laser 14.

Rather than using only a single sampler PCE to obtain information, as taught by the prior art, the present invention utilizes two or more sampler PCEs 15 along transmission line 35. Because of the space limitations imposed by on-chip microwave applications, it is probable that incident and reflected signals on transmission line 35 would overlap at the sampling point of a single PCE. To avoid the consequence of this interference, two or more sampler PCEs 15 are used to insure that incident and reflected signals can be distinguished.

Figure 2:
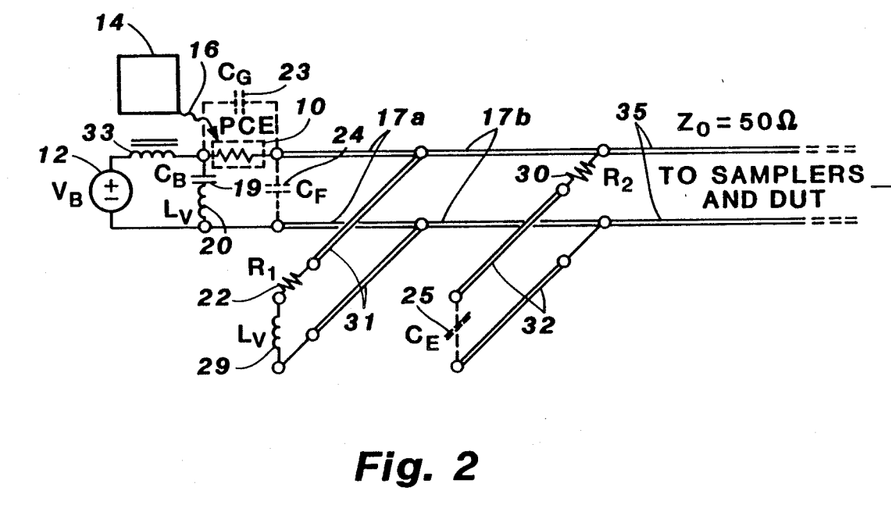
FIG. 2 is an equivalent circuit diagram of the pulse generator and conditioning network of the photoconductive circuit element reflectometer.

Pulse conditioning network 13 is shown in equivalent schematic detail in FIG. 2, along with PCE 10. The component values indicated in FIG. 2 are associated with the described embodiment, and not in limitation, and relate to a reflectometer having a usable bandwidth to approximately 160 GHz.

As illustrated in FIG. 2, PCE 10 is voltage biased by direct current voltage source 12 through rf choke 33, whose purpose is to prevent any radio frequency signals from flowing back through voltage source 12. A 10 pF blocking capacitance 19 is connected to the series connection of voltage source 12 and rf choke 33 and to 0.02 nH inductance 20, the inherent inductance resulting from the plating of the grounding hole through the substrate, also referred to as via hole inductance 20.

Parasitic gap capacitance 23 is shown in dashed lines across PCE 10 and represents the parasitic capacitance created by the gap between conductors associated with PCE 10. In like manner, parasitic fringe capacitance 24 is shown in dashed lines across transmission line segment 17a at its connection to PCE 10. Capacitance 24 represents the parasitic capacitance resulting from the proximity of the elements of transmission line segments 17a and 17b, and of transmission line 35.

Transmission line segment 17a has an impedance of 100 Ω and a length of 0.0038 in. between its connection to PCE 10 and the connection of transmission line segment 31. Transmission line segment 31 has an impedance of 100 Ω and a length of 0.006 in. and terminates at the series connection of 75 Ω resistance 22 and via hole inductance 29, having an inherent inductance of 0.02 nH.

Transmission line segment 17b is connected to the junction of transmission line segments 17a and 31, and has a characteristic impedance of 100 Ω and a length of 0.004 in. to the connection of 25 Ω resistance 30 which is connected to transmission line segment 32. Transmission line segment 32 has an impedance of 100 Ω, a length of 0.004 in., and is not terminated except for the effects of parasitic end capacitance 25. The connection of resistance 30 to transmission line segment 32 defines the output of pulse conditioning network 13 (FIG. 1) and is the point of attachment of main transmission line 35, which has a characteristic impedance of 50 Ω.

The above-described circuitry is effective to produce a train of extremely short electrical pulses when excited by a train of extremely short optical energy pulses 16 from laser 14. The repetition frequency of the electrical pulses from PCE 10, $f_p$, coincides with the frequency of laser 14 and is, for most applications, in the vicinity of 100 MHz. The conductance of PCE 10, $g_p(t)$, can be approximated by the following expression:

$$g_p(t) = G_p * e^{-t/\tau_p}, \; N/f_p \leq t < (N + 1)/f_p; \quad (1)$$

where $G_p$ is the peak conductance of radiation-damaged PCE 10, and $\tau_p$ represents its electron-hole pair recombination time constant. Neglecting the effect of the parasitic capacitances of the embodiment, the incident voltage on transmission line 35, $V_{inc}(f)$, represented in the frequency domain, is approximately given by:

$$V_{inc}(f) \simeq V_B \cdot R_o \cdot G_p \cdot f_p \cdot \tau_p \cdot \sum_{n=(-\infty)}^{+\infty} \Bigg( \delta(f - nf_p) \cdot \qquad (2)$$

$$\sum_{k=0}^{+\infty} (-R_o \cdot G_p)^k / (k + 1 + j2\pi n f_p \tau_p) \Bigg);$$

where $R_o$ is the characteristic impedance of transmission line 35, and $V_B$ is the voltage provided by direct current voltage source 12. Where $1/G_P$ is considerably larger than $R_o$, the usual case, only the lowest order term in the summation over k needs to be retained.

Thus, the frequency spectrum of the incident pulses, absent pulse conditioning network 13, consists of individual components spaced $f_p$ apart, having a low-pass type amplitude envelope that drops off at a rate of 6 dB per octave beyond the critical frequency determined by the equation:

$$f_c = 1/(2\pi\tau_p). \qquad (3)$$

Figure 3:
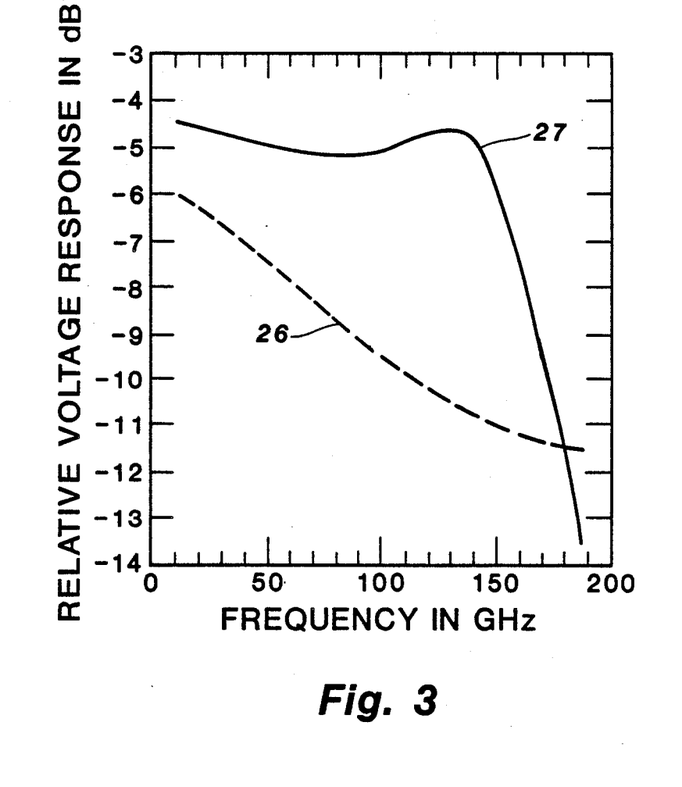
FIG. 3 is a graph comparing the frequency envelope responses of an unconditioned photoconductive circuit element pulse (broken line) to that of a conditioned pulse (solid line).

The effectiveness of pulse conditioning network 13 in overcoming this roll-off is illustrated in FIG. 3. The relative voltage response (in dB) of the electrical pulse generated by light modulated PCE 10 is plotted versus frequency (in GHz) for cases with and without pulse conditioning network 13. Dashed line curve 26 represents the envelope frequency response of the pulse without the conditioning provided by pulse conditioning network 13. Solid line curve 27 represents the envelope frequency response of the pulse after conditioning. As shown, pulse conditioning network 13 is effective in extending the frequency response of the reflectometer to approximately 160 GHz.

Figure 4:
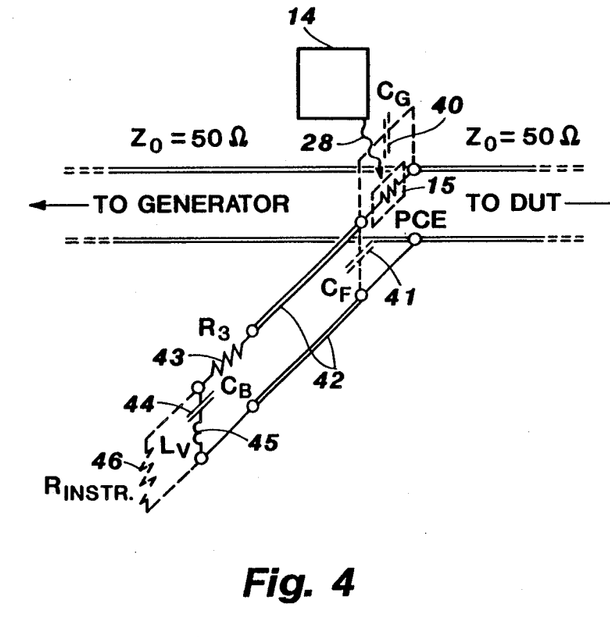
FIG. 4 is an equivalent circuit diagram of a typical sampler circuit, including a sampler photoconductive circuit element and its associated impedance matching and low-pass filter network.

A typical sampler network is shown as an equivalent circuit in FIG. 4, and comprises a sampler PCE 15 and the associated sampler network 18 (FIG. 1). Component values are provided by way of example and not limitation. As indicated, sampler PCE 15 is connected directly to transmission line 35, and functions to admit samples of signals on transmission line 35. The output of PCE 15 is connected to sampler transmission line segment 42, which has an impedance of 100 Ω and a length of 0.006 in. Transmission line segment 42 is terminated by 200 Ω resistance 43 in series with 10 pF blocking capacitance 44 and 0.02 nH via hole inductance 45. This circuitry minimizes the effective sampling aperture of PCE 15, and electronically minimizes parasitic disturbances that might interfere with accurate measurements.

Low frequency recorder 46, which may involve a lock-in amplifier, is coupled to sampler network 18 across the series connection of capacitance 44 and via hole inductance 45. Parasitic gap capacitance 40, resulting from the capacitance of the gap between transmission line 35 and transmission line segment 42 for PCE 15, and parasitic fringe capacitance 41, resulting from the proximity of the conductors comprising transmission line segment 42, are indicated in the circuit by dashed lines.

In operation, a train of extremely fast second optical energy pulses 28 from laser 14, spaced apart in time a variable period with respect to pulses 16 by the use of a series of mirrors, is focused on PCE 15. These pulses 28, with pulse widths in the range of 100 fs, open brief conductance windows in PCE 15 to admit samples of the signals appearing on transmission line 35, such conductance windows being about 2 ps in width. The samples admitted by PCEs 15 are in the form of a train of pulses and possess a spectrum comprised of discrete frequency components. The discrete frequency components are processed by sampler networks 18 to provide the required low-pass filtering and to minimize undesirable parasitic circuit effects on the derived signals. The processed signals, being slowed-motion images of the signals on transmission line 35, are then conducted to low-frequency recorder 46.

As previously discussed, other purposes of the sampler networks 18 (FIG. 1) are minimizing the effective sampling aperture, or time response, of PCEs 15, and minimizing the parasitic perturbation of the incident and reflected signals propagating along transmission line 35. Although the circuit accomplishing these functions is relatively straightforward, the analytical considerations are somewhat more complicated, involving both the time-windowing effects of PCEs 15, and the frequency-windowing effects of the circuit components, including the parasitic elements.

The operation of sampler networks 18 can be described in the frequency domain as:

$$Y_I(f)\cdot V_I(f) = G_s(f)*[V(f) - V_I(f)] + Y_s(f)\cdot [V(f) - V_I(f)]; \qquad (4)$$

where V is the voltage on transmission line 35 at the point of sampling, $V_I$ is the voltage at the input of a sampling network 18 (FIG. 1), $Y_I$ is the input admittance of sampling network 18, $G_s$ represents the conductance of a PCE 15, and $Y_s$ is the parasitic reactance of a PCE 15. From this equation it is necessary to solve for the components of the voltage appearing across transmission line 35 at the point of sampling, $V(nf_p)$ for n=0, 1, ..., based on knowledge of the measured broadband response of $V_I(nf_p)$ for n=0, 1, ...

In practical applications, $Y_I(f)$ will be orders of magnitude greater than $G_s(f)$ at respective harmonics of $f_p$. This condition must be satisfied to insure that the samples of signals admitted by PCEs 15 will form true slowed-motion images of the signals appearing on transmission line 35. From this assumption, and other practical considerations, the following explicit solution can be derived:

$$V(nf_p) = [1 + Y_s(nf_p)/Y_I(nf_p)- \\ ]\cdot Y_I(n\Delta f)/G_s(-nf_s)\cdot V_I(n\Delta f), n=0, 1 \ldots; \qquad (5)$$

where $f_p$ is the frequency of the electrical pulses from PCE 10, $f_s$ is the frequency of the conductance periods of PCEs 15, and $\Delta f = f_p - f_s$.

Similarly, the effective shunt admittance, $Y_{eff}$, presented to transmission line 35 by PCEs 15 and their associated sampler networks 18, at harmonics of $f_p$, can be written as:

$$Y_{eff}(nf_p) = [1/Y_I(nf_p) + 1/Y_s(nf_p)]^{-1}, n=0, 1, \qquad (6)$$

Although both of these expressions are approximations, they have been verified to be accurate to 1 per mille in practical applications.

Referring back to FIG. 1, it is important to note the differences between the prior art and the present invention regarding the application of sampling circuits. The prior art taught the use of only a single sampling PCE to obtain information about signals propagating along a transmission line. However, because of the small spacing allowed by on-chip applications, it is extremely likely that incident and reflected signals would coincide in time at the point of sampling. As an example of the size constraints, an embodiment of the present invention places all of the described components on a single semiconductor chip having an overall length of 2.5 mm.

Becuase of these size constraints, the present invention teaches the use of at least two sampling networks. This assures that the incident and reflected signals can be separately measured by the sampling PCEs 15.

While it is possible to obtain all necessary information about incident and reflected signals on transmission line 35 through the use of two sampling circuits placed at any two points along transmission line 35, it should be understood that the sampling circuits will be unable to resolve the spectral components of a signal when the spacing between the circuits is equal to a multiple of the half wavelength of that component. Thus, the spacing between samplers is the only concern in the two sampler case, in order to insure that the spacing is less than a half wavelength at the highest frequency to be measured. Even this concern is overcome by the use of three sampler circuits to fill in any missing information. The only criteria for sampler placement in the three circuit case is that the spacings between the connection points of the circuits preferably be unequal.

Numerous physical configurations could accommodate the present invention. However, it lends itself most effectively to monolithic technology. The deposition of PCE 10 and PCEs 15, pulse conditioning network 13, sampler networks 18, microstrip transmission line 35, and device under test 36 all directly onto a semiconductor chip provides an extremely effective measuring device whose overall size is primarily dictated by the lowest frequency to be utilized.

It should be noted that this invention is not limited to microstrip configurations, but is applicable equally well to other types of transmission lines, such as coplanar waveguide, coplanar stripline, or slot line, mounted on a chip capable of accommodating the PCEs and the particular DUT. The use of coaxial transmission line is also possible. It should also be recognized that the invention is not only applicable to reflection measurements, but is useful in the measurement of the transmission characteristics of two port devices simply by a rearrangement of the locations of the sampler PCEs.

The foregoing detailed description of the embodiments of the present invention has been presented for purposes of illustration and description and is not intended to be exhaustive or to limit the invention to the precise form disclosed. It was chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A photoconductive reflectometer for characterizing a high-frequency semiconductor device by generating a slowed-motion image of a signal reflected from the device, comprising:
    pulse means for generating extremely short electrical pulses for reflection by said device;
    a plurality of photoconductive circuit elements intermediate said pulse means and said device at locations effective to admit samples of electrical signals between said pulse means and said device;
    a plurality of filter means connected to said plurality of photoconductive circuit elements for electronically filtering out high-frequency components from said samples and for outputting filtered samples in the form of slowed-motion images of said signals between said pulse means and said device; and
    optical excitation means for sequentially exciting said plurality of photoconductive circuit elements for extremely short periods and at intervals effective for said admissions.

2. A photoconductive reflectometer according to claim 1, wherein said pulse means comprise:
    voltage means for providing a direct current voltage and current;
    a photoconductive circuit element coupled to said voltage means effective to conduct the current provided by said voltage means in the form of extremely short electrical pulses;
    laser means focused on said photoconductive circuit element for optically exciting said photoconductive circuit element into extremely short periods of conductance with extremely short optical energy pulses; and
    pulse conditioning means connected to said photoconductive circuit element for improving the frequency related amplitude characteristics of said electrical pulses.

3. A reflectometer according to claim 1, wherein said extremely short electrical pulse and said extremely short periods comprise approximately 2 ps.

4. A reflectometer according to claim 1, wherein said plurality of photoconductive circuit elements comprises two photoconductive circuit elements.

5. A reflectometer according to claim 1, wherein said plurality of photoconductive circuit elements comprises three photoconductive circuit elements.

6. A reflectometer according to claim 2, wherein said extremely short optical energy pulses comprise pulse widths of approximately 100 fs.

7. A reflectometer according to claim 1, wherein said filter means is effective to optimize the time response of said photoconductive circuit elements and to minimize parasitic interference with said signals between said pulse means and said device.

8. A reflectometer according to claim 1, further comprising transmission line means for connecting said pulse means to said semiconductor device.

9. A reflectometer according to claim 8, wherein said transmission line means comprises microstrip, coplanar waveguide, coplanar stripline, slot line, or coaxial transmission lines.

10. A reflectometer according to claim 8, wherein said pulse means, said transmission line means, said photoconductive samplers and said device are all located on a single semiconductor chip.

11. A reflectometer according to claim 2 or claim 1, wherein said photoconductive circuit elements are comprised of radiation damaged gallium arsenide.

12. A method of electronically characterizing semiconductor devices or circuits at millimeter wavelength frequencies through analysis of slowed-motion images of the signals reflected from such devices, comprising:
    focusing a first series of laser light pulses on a first photoconductive circuit element biased by a direct current voltage from a voltage source, thereby producing a series of electrical pulses with pulse widths of approximately 2 ps;

conditioning said electrical pulses to improve the frequency related amplitude characteristics of said electrical pulses;

propagating said conditioned electrical pulses along a transmission line to a semiconductor device under test;

admitting samples of the signals propagating along said transmission line means through a plurality of second photoconductive circuit elements coupled to said transmission line and modulated into very short periods of conductance by a second series of extremely short laser light pulses spaced apart in time a determinable period from said first laser light pulses and focused on said plurality of photoconductive circuit elements;

electronically filtering out high-frequency components from said samples admitted by said plurality of second photoconductive circuit elements; and outputting said samples in the form of slowed-motion images of said signals propagating along said transmission line.

* * * * *